United States Patent
Zhu et al.

(10) Patent No.: US 8,138,081 B2
(45) Date of Patent: Mar. 20, 2012

(54) ALUMINUM BUMP BONDING FOR FINE ALUMINUM WIRE

(75) Inventors: Adams Zhu, Suzhou (CN); Xingquan Fang, Suzhou (CN); Fred Ren, Suzhou (CN); Yongsuk Kwon, Suzhou (CN)

(73) Assignee: Fairchild Semiconductor Corporation, South Portland, ME (US)

( * ) Notice: Subject to any disclaimer, the term of this patent is extended or adjusted under 35 U.S.C. 154(b) by 54 days.

(21) Appl. No.: 12/580,560

(22) Filed: Oct. 16, 2009

(65) Prior Publication Data

US 2010/0035385 A1 Feb. 11, 2010

Related U.S. Application Data

(62) Division of application No. 11/385,022, filed on Mar. 20, 2006, now abandoned.

(51) Int. Cl.
*H01L 21/44* (2006.01)

(52) U.S. Cl. .............. 438/617; 438/613; 257/E21.509; 257/784

(58) Field of Classification Search ........... 257/E21.502, 257/687, 737, 738, 784, E23.033, E21.509; 438/123, 613, 617
See application file for complete search history.

(56) References Cited

U.S. PATENT DOCUMENTS

| | | | |
|---|---|---|---|
| 3,894,918 A | 7/1975 | Corby et al. | |
| 4,442,967 A * | 4/1984 | van de Pas et al. | 228/159 |
| 4,845,543 A * | 7/1989 | Okikawa et al. | 257/738 |
| 5,290,732 A | 3/1994 | Kumar et al. | |
| 5,296,744 A * | 3/1994 | Liang et al. | 257/784 |
| 5,328,079 A * | 7/1994 | Mathew et al. | 228/180.5 |
| 5,436,082 A * | 7/1995 | Mathew | 428/670 |
| 5,494,713 A * | 2/1996 | Ootuki | 427/579 |
| 5,735,030 A * | 4/1998 | Orcutt | 29/860 |
| 5,808,354 A * | 9/1998 | Lee et al. | 257/666 |
| 5,960,262 A * | 9/1999 | Torres et al. | 438/123 |
| 5,976,964 A * | 11/1999 | Ball | 438/613 |
| 6,017,777 A | 1/2000 | Kim et al. | |
| 6,028,011 A | 2/2000 | Takase et al. | |
| 6,034,440 A | 3/2000 | Ball | |
| 6,079,610 A * | 6/2000 | Maeda et al. | 228/180.5 |
| 6,176,417 B1 * | 1/2001 | Tsai et al. | 228/180.5 |
| 6,413,797 B2 * | 7/2002 | Oka et al. | 438/108 |
| 6,429,028 B1 * | 8/2002 | Young et al. | 438/4 |
| 6,467,677 B1 * | 10/2002 | Wildner | 228/180.5 |
| 6,527,163 B1 * | 3/2003 | Eslampour | 228/180.1 |

(Continued)

OTHER PUBLICATIONS

Kulicke & Soffa, "Aluminum Bonding Wire" Mar. 11, 2006, entire document printed from htt;://web.archive.org/web/20060311075832/http//www.kns.com/Templates/Show Page.asp?TMID=1088FID-122&PID-2524 printed Oct. 26, 2007, 1 page.

*Primary Examiner* — Chris Chu
(74) *Attorney, Agent, or Firm* — Hiscock & Barclay, LLP

(57) ABSTRACT

The invention includes a packaged semiconductor device in which the bond wires are bonded to the leads with an aluminum bump bond. The semiconductor device is mounted on a leadframe having leads with a nickel plating. To form the bump bond between a fine aluminum wire, such as a 2 mil diameter wire, and the lead, an aluminum bump is bonded to the nickel plating and the wire is bonded to the bump. The bump is aluminum doped with nickel and is formed from a large diameter wire, such as a 6 mil diameter wire.

13 Claims, 2 Drawing Sheets

U.S. PATENT DOCUMENTS

| | | | |
|---|---|---|---|
| 6,561,411 B2 * | 5/2003 | Lee | 228/180.5 |
| 6,680,545 B2 | 1/2004 | Young et al. | |
| 6,715,666 B2 * | 4/2004 | Imai et al. | 228/180.5 |
| 6,790,757 B1 * | 9/2004 | Chittipeddi et al. | 438/612 |
| 6,858,943 B1 * | 2/2005 | Peterson et al. | 257/784 |
| 7,025,247 B2 * | 4/2006 | Mii et al. | 228/180.5 |
| 7,053,489 B2 * | 5/2006 | Kraus et al. | 257/780 |
| 7,067,413 B2 * | 6/2006 | Kim et al. | 438/617 |
| 7,180,161 B2 * | 2/2007 | Chiang et al. | 257/666 |
| 7,268,415 B2 * | 9/2007 | Abbott et al. | 257/666 |
| 7,285,854 B2 * | 10/2007 | Ishikawa et al. | 257/738 |
| 7,576,439 B2 * | 8/2009 | Craig et al. | 257/784 |
| 7,731,078 B2 * | 6/2010 | Lee et al. | 228/180.5 |
| 7,777,353 B2 * | 8/2010 | Ohkawa | 257/784 |
| 7,863,099 B2 * | 1/2011 | Do et al. | 438/109 |
| 2004/0152292 A1 * | 8/2004 | Babinetz et al. | 438/617 |
| 2004/0164128 A1 * | 8/2004 | Mii | 228/180.5 |
| 2006/0047194 A1 | 3/2006 | Grigorov | |
| 2006/0049523 A1 * | 3/2006 | Lin | 257/738 |
| 2006/0091535 A1 | 5/2006 | Tsao et al. | |

* cited by examiner

US 8,138,081 B2

ALUMINUM BUMP BONDING FOR FINE ALUMINUM WIRE

CROSS-REFERENCE TO RELATED APPLICATIONS

This application is divisional application of, and claims priority to U.S. patent application Ser. No. 11/385,022, filed Mar. 20, 2006, the contents of which are incorporated by reference.

FIELD OF THE INVENTION

This invention relates to the bonding application of aluminum wire to a surface such as a leadframe or a contact on a semiconductor device.

BACKGROUND OF THE INVENTION

Conventionally, aluminum bond wire connecting the features of a semiconductor die to the leads of a leadframe in a semiconductor package are bonded directly to the leadframe. The common issues associated when using this method with fine aluminum bond wire (less than about 3 mil diameter) include heel break and bond lift. Heel lift occurs when the bonding parameters are set too high and the bond wire breaks at the bond, potentially resulting in the loss of electrical communication between the semiconductor feature and the lead. Bond lift generally occurs when the bonding parameters are set too low and the bond disengages from the lead. Thus, there is a narrow range of bonding parameters that will result in a resilient bond. Further, the bonding parameters for bonding fine aluminum wire directly to the leadframe are quite sensitive to the material composition of the aluminum wire and the surface condition of the leadframe.

The bond stitch on bump method for bonding gold wires to a leadframe uses a gold bump on the leadframe as the interface between the bond wire and the leadframe. This relaxes the range of bonding parameters for gold bond wires. Other methods may use solder bumps in a similar fashion. However, neither of these methods are suitable for bonding aluminum wire.

There exists a number of U.S. patents directed to wire bonding in semiconductor packaging including U.S. Pat. No. 6,413,797 issued to Oka, et al. on Jul. 2, 2002. Oka teaches a semiconductor device with electrodes having gold bumps disposed thereon in a gold plating process. The gold bumps facilitate the bonding of gold wires to the electrodes. Oka does not teach an inexpensive and simple method of providing an aluminum bump for bonding fine aluminum wire to surfaces.

Therefore, what is desired is a method of bonding fine aluminum wire that has relaxed bonding parameters, that shows improved reliability in reduced heel crack and bond lift situations, and that is inexpensive.

SUMMARY OF THE INVENTION

The invention comprises, in one form thereof, a packaged semiconductor device in which the bond wires are bonded to the leads with an aluminum bump bond. The semiconductor device is mounted on a leadframe having leads with a nickel plating. To form the bump bond between a fine aluminum wire, such as a 2 mil diameter wire, and the lead, an aluminum bump is bonded to the nickel plating and the wire is bonded to the bump. The bump is aluminum doped with nickel and is formed from a large diameter wire, such as a 6 mil diameter wire.

In another form, the invention includes a method for packaging a semiconductor device. The method comprises the steps of providing a leadframe with a semiconductor device attached thereto, wherein the leadframe has a plurality of leads; building a bump on the surface of one or more of the leads; and wire bonding an aluminum bond wire to each of the bumps. The bond wire has a fine diameter, such as a diameter of about 2 mil, and the bump has a large diameter, such as a diameter of about 6 mil. The bump comprises aluminum and it may be doped with nickel. The leads may have a nickel plating. The method may also include the further step of encapsulating the leadframe, semiconductor device, and bond wires in a non-conducting encapsulation polymer.

An advantage of the present invention is that the aluminum to nickel bond is achieved through the large diameter bump and the fine aluminum wire is the able to be bonded to an aluminum surface. While the fine wire aluminum to nickel bond has been shown to be unreliable and particularly sensitive to surface conditions and bonding parameters, the large diameter wire aluminum to nickel bond has been shown to be robust and less sensitive to surface conditions and bonding parameters. Further, the invention shows a great reduction in bond lift and heel crack conditions.

BRIEF DESCRIPTION OF THE DRAWINGS

The present invention is disclosed with reference to the accompanying drawings, wherein.

Corresponding reference characters indicate corresponding parts throughout the several views. The example set out herein illustrates one embodiment of the invention but should not be construed as limiting the scope of the invention in any manner.

DETAILED DESCRIPTION

Figure 1:
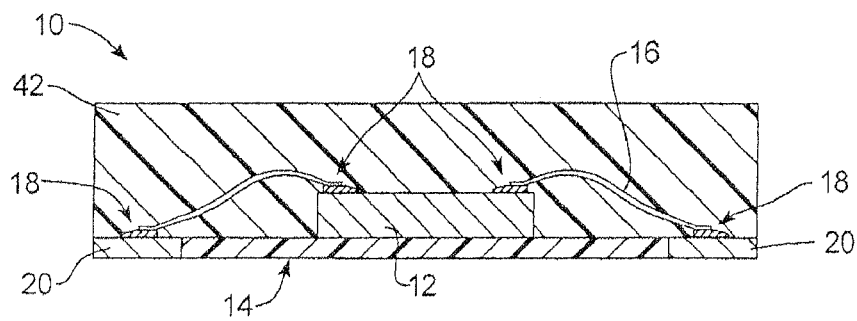
FIG. 1 is a cross-sectional view of a semiconductor package using aluminum bump bonds according to the present invention.

Referring to FIG. 1, there is shown a semiconductor package having the aluminum bump bonds of the present invention. The package 10 includes a semiconductor device 12, a leadframe 14, several aluminum bond wires 16, and several bump bonds 18.

The leadframe 14 includes several leads 20 and a die pad (not shown) for supporting the semiconductor device 12. The semiconductor device includes several electrodes for being connected to the leads 20 by the bond wires 16. In a particular embodiment, the bond wires 16 have a diameter of about 2 mil (50 μm) and a composition of about 99% aluminum and about 1% silicon. However, the wire 16 may have alternative characteristics in different embodiments. For the purposes of this description, a fine wire is a wire having a diameter of 3 mil or less and a large diameter wire has a diameter of greater than 3 mil.

Figure 2:
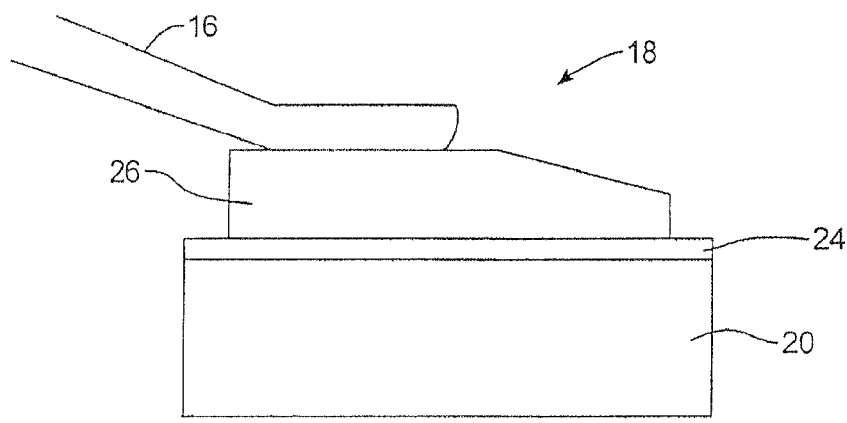
FIG. 2 is a side view of the aluminum bump bond of a wire to a lead according to FIG. 1.
Figure 3A:
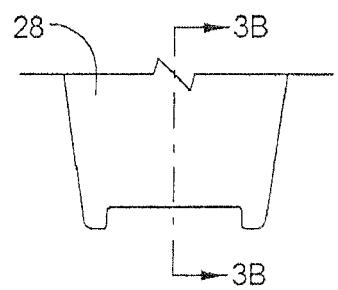
FIG. 3A is a front view of the tip of a wedge tool for forming the aluminum bumps according to FIG. 2.
Figure 3B:
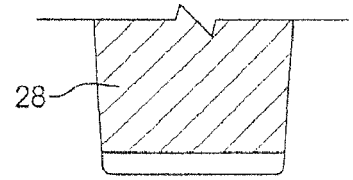
FIG. 3B is a cross-sectional view of the wedge tool tip of FIG. 3A.

The bump bond 18 is shown in detail in FIG. 2, bonding a wire 16 to a lead 20. The lead 20 is typically copper with a nickel plating 24 on its surface. The bump bond 18 includes an aluminum bump 26 comprising a portion of large diameter aluminum wire, such as a diameter of about 6 mil (150 μm). In a particular embodiment, the bump 26 comprises aluminum doped with nickel. The bump 26 is bonded to the nickel plating 24 similarly to the leadframe bonding of a 6 mil wire, except that the wedge tool has a flat surface as opposed to the triangular wedge normally used. The flat tip wedge tool 28, shown in FIGS. 3A and 3B, provides a bonded bump 26 with a flat surface for bonding with the wire 16. Since the bump 26 doesn't have heel like a wire would, the wedge tool 28 does not have an upward curve on the wedge surface to accommodate the heel as a conventional wedge tool would.

Figure 4:
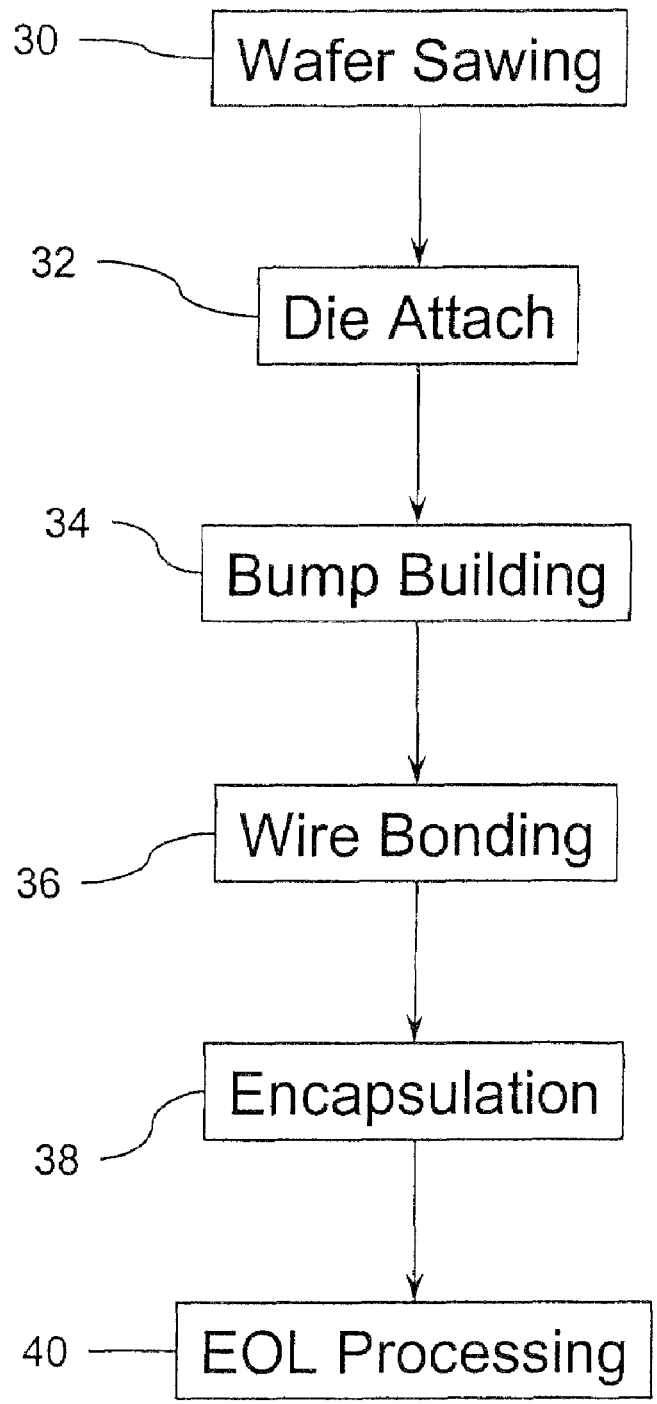
FIG. 4 is a flow chart of the aluminum bump bonding process of the present invention.

Referring to FIG. 4, the process of the invention includes the steps of wafer sawing 30, die attach 32, bump building 34, wire bonding 36, encapsulation 38, and the typical end-of-line finishing and testing 40. The wafer sawing step 30 and the die attach step 32 are particular to the semiconductor device and leadframe. The bump building step 34 comprises the bonding of the end of a 6 mil aluminum wire to the nickel plating 24 on a lead 20 using the flat tip wedge tool 28. The 6 mil wire is then broken away from the end to leave the bump 26. In a particular embodiment, care is taken to line up the length of the bump 26 with the direction of the wire 16 that will be bonded thereto. Further, the size of the bump 26 should be at least as big as the gate pad opening on the semiconductor chip. In the wire bonding step 36, the end of the aluminum wire 16 is bonded to the aluminum bump 26 using typical wire bonding techniques. Non-conducting encapsulation polymer 42 (FIG. 1) is molded over the package in the encapsulation step 38. The typical finishing and testing is then carried out in step 40.

Thus, the aluminum to nickel bond is between the nickel plating 24 and the bump 26, which is a piece of 6 mil aluminum wire. Such bonds have been shown to be a much more reliable process with relaxed bond parameters than the direct bonding between a fine aluminum wire and the nickel plating. Further, the fine aluminum wire 16 is bonded to the bump 26 in an aluminum to aluminum bond, which is inherently more reliable than the aluminum to nickel bond of the fine wire. It has also been shown that even with low bonding parameter specification limits, the bump bond 18 has improved results in a bond shear test and a bond pull test over the fine wire aluminum to nickel bond. Further, the bond thickness of the wire 16 is improved resulting in better resistance to heel crack.

In alternative embodiments, other wire and bond sizes may be used. For example, a wire bond for a 5 mil wire may use a 20 mil bump.

While the invention has been described with reference to preferred embodiments, it will be understood by those skilled in the art that various changes may be made and equivalents may be substituted for elements thereof to adapt to particular situations without departing from the scope of the invention. Therefore, it is intended that the invention not be limited to the particular embodiments disclosed as the best mode contemplated for carrying out this invention, but that the invention will include all embodiments falling within the scope and spirit of the appended claims.

The invention claimed is:

1. A method of packaging a semiconductor device, comprising the steps of:
   providing a leadframe with a semiconductor device attached thereto, the leadframe having a plurality of leads;
   building a first bump on the surface of one or more of the leads;
   forming a substantially flat surface on the first bump with a flat tip wedge tool; and
   wire bonding a first end of an aluminum bond wire to the substantially flat surface on the first bump.

2. The method of claim 1, the bond wire having a fine diameter.

3. The method of claim 2, the first bump building step comprising bonding a portion of a large-diameter aluminum wire to one or more of the leads; and breaking the large-diameter wire away from the portion to leave a bump.

4. The method of claim 1, the bond wire having a diameter of about 2 mil.

5. The method of claim 1, the first bump building step comprising bonding a portion of a large-diameter aluminum wire to one or more of the leads; and breaking the large-diameter wire away from the portion to leave a bump.

6. The method of claim 5, wherein the flat tip wedge tool forms a substantially flat surface on the bonding portion of the large-diameter aluminum wire.

7. The method of claim 5, the first bump having a diameter of about 6 mil.

8. The method of claim 1, the first bump comprising aluminum.

9. The method of claim 8, the leads having a nickel plating and the first bump being doped with nickel.

10. The method of claim 1, further comprising the step of encapsulating the leadframe, semiconductor device, and bond wires in a non-conducting encapsulation polymer.

11. The method of claim 1, further comprising the step of building a second bump on the surface of the semiconductor device.

12. The method of claim 11, further comprising the step of wire bonding a second end of an aluminum bond wire to the second bump on the surface of the semiconductor device.

13. The method of claim 1, wherein one or more of the leads are a copper lead with nickel plating.

* * * * *